(12) United States Patent
Harper (10) Patent No.: US 11,876,279 B2
(45) Date of Patent: Jan. 16, 2024

(54) HYBRID CAVITY MODE ANTENNA

(71) Applicant: Microsoft Technology Licensing, LLC, Redmond, WA (US)

(72) Inventor: Marc Harper, Snohomish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 558 days.

(21) Appl. No.: 16/887,209

(22) Filed: May 29, 2020

(65) Prior Publication Data

US 2021/0265735 A1    Aug. 26, 2021

Related U.S. Application Data

(60) Provisional application No. 62/981,129, filed on Feb. 25, 2020.

(51) Int. Cl.
| | | |
|---|---|---|
| *H01Q 13/18* | (2006.01) | |
| *H01Q 9/40* | (2006.01) | |
| *H01Q 7/00* | (2006.01) | |
| *H05K 1/02* | (2006.01) | |

(52) U.S. Cl.
CPC ............ *H01Q 13/18* (2013.01); *H01Q 7/00* (2013.01); *H01Q 9/40* (2013.01); *H05K 1/0243* (2013.01)

(58) Field of Classification Search
CPC ............ H01Q 7/00; H01Q 9/40; H01Q 13/18; H05K 1/0243
See application file for complete search history.

(56) References Cited

U.S. PATENT DOCUMENTS

| | | | |
|---|---|---|---|
| 7,511,670 | B2 | 3/2009 | Rao et al. |
| 8,880,132 | B2 | 11/2014 | Kwon et al. |
| 9,673,511 | B2 | 6/2017 | Lee et al. |
| 9,917,346 | B2 | 3/2018 | Ramachandran et al. |
| 10,374,289 | B2 | 8/2019 | Hu et al. |
| 10,511,082 | B2 | 12/2019 | Perez et al. |
| 10,944,153 | B1 * | 3/2021 | Yarga ...................... H01Q 5/30 |
| 2013/0278480 | A1 | 10/2013 | Mcmilin et al. |

(Continued)

FOREIGN PATENT DOCUMENTS

CN    108270076 A    7/2018

OTHER PUBLICATIONS

Antenna Theory: A Review, Balanis, Proc. IEEE vol. 80 No Jan. 1, 1992 (Year: 1992).*

(Continued)

*Primary Examiner* — Graham P Smith
*Assistant Examiner* — Amal Patel
(74) *Attorney, Agent, or Firm* — Holzer Patel Drennan (57) ABSTRACT

A communication device includes a metal chassis, a printed circuit board positioned within the metal chassis, and a hybrid cavity mode antenna. The hybrid cavity mode antenna includes a conductive wall defining at least a portion of a cavity, wherein the cavity is further defined by one or more surfaces of the metal chassis and the printed circuit board, and an electrically-fed antenna configured to radiate a first radiofrequency signal in a first frequency range. The electrically-fed antenna is electrically driven from the printed circuit board of the communication device. The electrically-fed antenna is positioned within the cavity to drive the cavity to radiate a second radiofrequency signal in a second frequency range.

24 Claims, 6 Drawing Sheets

(56) References Cited

U.S. PATENT DOCUMENTS

| | | | | |
|---|---|---|---|---|
| 2013/0335275 A1* | 12/2013 | Sanford | ............... | H01Q 1/42 |
| | | | | 343/702 |
| 2014/0112511 A1* | 4/2014 | Corbin | ............... | H05K 9/006 |
| | | | | 343/702 |
| 2014/0347226 A1* | 11/2014 | Iellici | ............... | H01Q 1/243 |
| | | | | 343/702 |
| 2020/0227821 A1* | 7/2020 | Wu | ............... | H01Q 1/38 |
| 2021/0175610 A1* | 6/2021 | Ramasamy | ............... | H01Q 1/48 |

OTHER PUBLICATIONS

"International Search Report and Written Opinion Issued in PCT Application No. PCT/US2021/014038", dated Apr. 29, 2021, 13 Pages.

Chou, et al., "A Compact Loop-Slot Mode Combination Antenna for Ultra-Thin Tablet Computer with Metallic Bottom Cover", In Journal of IEEE Antennas and Wireless Propagation Letters, vol. 13, Apr. 9, 2014, pp. 746-749.

Su, Saou-Wen, "Compact four-loop-antenna system for concurrent, 2.4- and 5-GHz WLAN operation", In Journal of Microwave and Optical Technology Letters, vol. 56, Issue 1, Jan. 2014, pp. 208-215.

Wu, et al., "A Compact GPS/WLAN Antenna Design for Mobile Terminal with Full Metal Housing", In Progress in Electromagnetics Research, vol. 64, Jan. 2016, pp. 169-177.

* cited by examiner

HYBRID CAVITY MODE ANTENNA

CROSS-REFERENCED TO RELATED APPLICATIONS

This application claims benefit of priority to U.S. Provisional Patent Application No. 62/981,129, entitled "Hybrid Cavity Mode Antenna" and filed on Feb. 25, 2020, which is specifically incorporated by reference for all that it discloses and teaches.

BACKGROUND

Existing Wi-Fi antenna designs in communication devices require slots in the metal device enclosure or case to enable antenna functionality (e.g., to isolate the antenna from the rest of the conducting metal enclosure, to form a slot antenna). Industrial design constraints, manufacturing requirements, detuning concerns, and other issues make such slots in the metal device enclosure generally undesirable.

SUMMARY

The described technology provides a communication device including a metal chassis, a printed circuit board positioned within the metal chassis, and a hybrid cavity mode antenna. The hybrid cavity mode antenna includes a conductive wall defining at least a portion of a cavity, wherein the cavity is further defined by one or more surfaces of the metal chassis and the printed circuit board, and an electrically-fed antenna configured to radiate a first radiofrequency signal in a first frequency range. The electrically-fed antenna is electrically driven from the printed circuit board of the communication device. The electrically-fed antenna is positioned within the cavity to drive the cavity to radiate a second radiofrequency signal in a second frequency range.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

DETAILED DESCRIPTIONS

An example antenna design provides a hybrid method of using a loop antenna to excite a first radiofrequency signal (e.g., at a 5 GHz antenna response) and a cavity mode antenna defined at least in part by the metal chassis of a communication device to excite a second radiofrequency signal (e.g., at a 2.5 GHz antenna response). The loop antenna is positioned within the cavity mode antenna bounds. With this antenna topology, no slots are needed in the metal chassis of the communication device to provide communications at these radiofrequency ranges, providing an industrial design look that is highly desirable and mechanical strength advantages over all previous designs.

Figure 1:
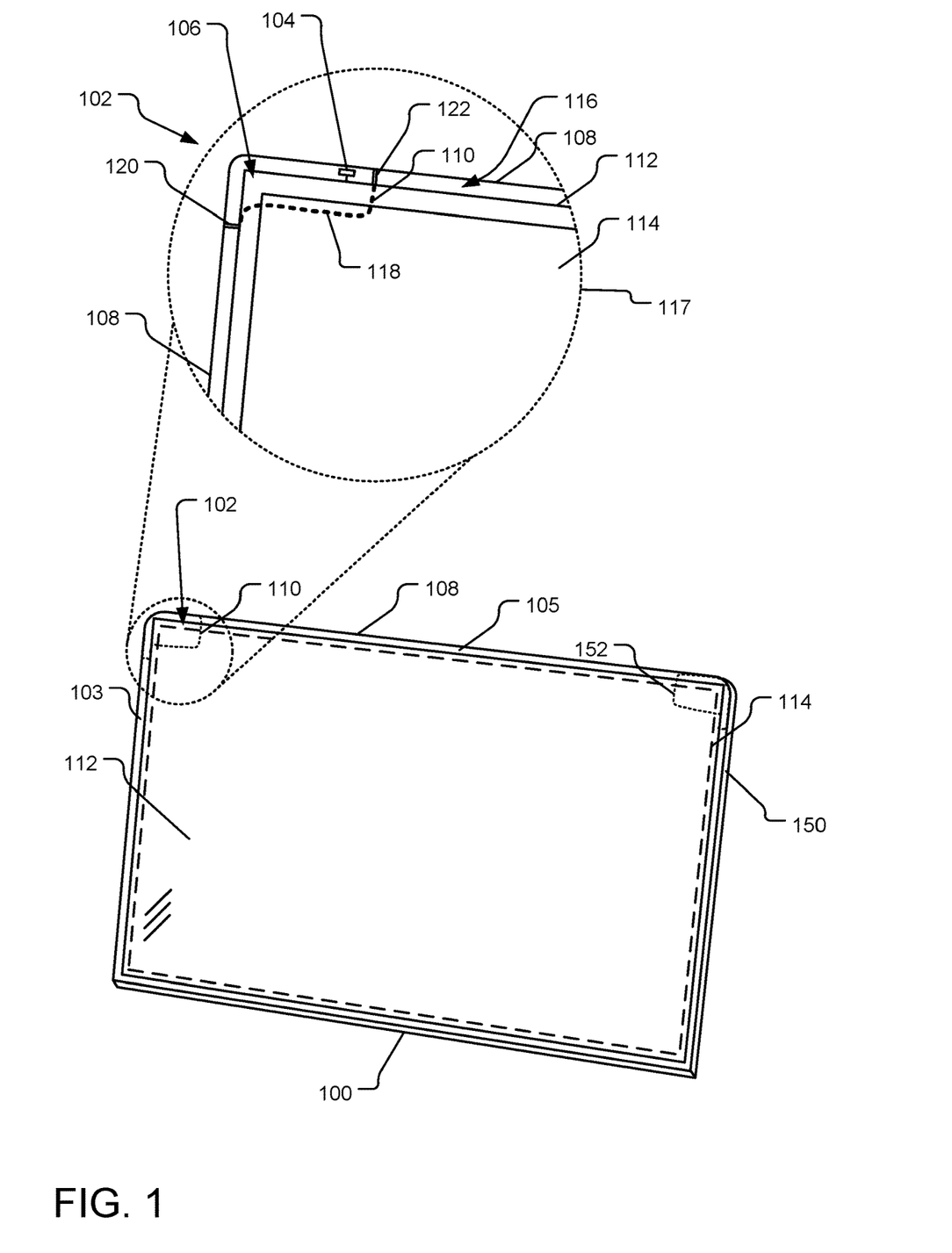
FIG. 1 illustrates a communication device including an example hybrid cavity mode antenna having a loop antenna and a cavity mode antenna.

FIG. 1 illustrates a communication device 100 including an example hybrid cavity mode antenna 102 having a loop antenna 104 and a cavity mode antenna 106. The loop antenna is electrically-fed an RF signal from a transmitter of the communication device 100. The example hybrid cavity mode antenna 102 is positioned within a metal chassis 108 of the communication device 100 and inductively and/or capacitively fed by the loop antenna 104. In FIG. 1, the metal chassis 108 defines at least a portion of a cavity 110 (e.g., two metal edge surfaces 103 and 105 and a back surface of the metal chassis 108 define at least two side walls and a back or bottom wall of the cavity 110, respectively). The communication device 100 also includes a display 112 and a printed circuit board 114 having a ground plane. The ground plane of the printed circuit board 114 defines a fourth wall of the cavity 110. Additional walls of the cavity 110 are defined by a conductive wall 118, which is described in more detail with regard to FIGS. 2, 3, and 6. In one implementation, the conductive wall 118 includes two grounding wall connectors 120 and 122 and a metal foam section (indicated by the dashed line connecting the two grounding wall connectors 120 and 122), although other implementations are contemplated, including without limitation a structural metal wall extending across the metal back surface from the first metal edge surface to the second metal edge surface (see FIG. 6). In one implementation, the surfaces of the cavity 110 are electrically grounded.

The display 112 and some of its constituent components (collectively, the "display assembly") act to substantially shield radiofrequency (RF) radiation from exiting the communication device 100. In this manner, the display assembly is considered "RF opaque" with respect to RF radiation passing between the interior and exterior of the communication device 100, although this term may apply to materials or components that do not block all such radiation (e.g., a material blocking substantially all or most of the RF radiation may be considered RF opaque).

Accordingly, the example hybrid cavity mode antenna 102 is positioned at or near a bezel region 116 in which the shielding material is not located. Instead, the bezel region 116 is considered "RF transparent" because it passes most or all of the RF radiation between the interior and exterior of the communication device 100, although this term may apply to materials or components that do block some amount of such radiation (e.g., a material passing substantially all or most of the RF radiation may be considered RF transparent or even RF translucent). An opening between the printed circuit board 114 and the metal chassis 108 presents a radiating slot in the cavity 110 from which a radiofrequency signal can radiate. The radiating slot is positioned to overlap or predominantly overlap the bezel region 116. As such, the described implementation can operate as a cavity-backed slot antenna. The loop antenna 104 is positioned within the cavity, operating at approximately 5 GHz and driving the cavity and the radiating slot at approximately 2.4 GHz.

As shown in the expanded view 117, the example hybrid cavity mode antenna 102 is positioned near the edge of the communication device 100, with the loop antenna 104 positioned in the bezel region 116 so that RF radiation may pass between the interior and exterior of the communication device 100 through the RF transparent bezel region 116. The loop antenna 104 is also positioned within the cavity 110 to excite the cavity mode of the cavity 110. It should be noted that the cavity 110 is also positioned at or near the bezel region 116 to radiate through the RF transparent materials of the bezel region 116.

A second hybrid cavity mode antenna 152 is also shown between the metal edge surface 105 and another metal edge surface 150. Additional hybrid cavity mode antennas may be employed in the same communication device 100. In addition, the locations of such hybrid cavity mode antennas may also vary from those illustrated implementations. For example, a hybrid cavity mode antenna may be positioned against the side of the metal chassis, rather than in the corner of the metal chassis.

Figure 2:
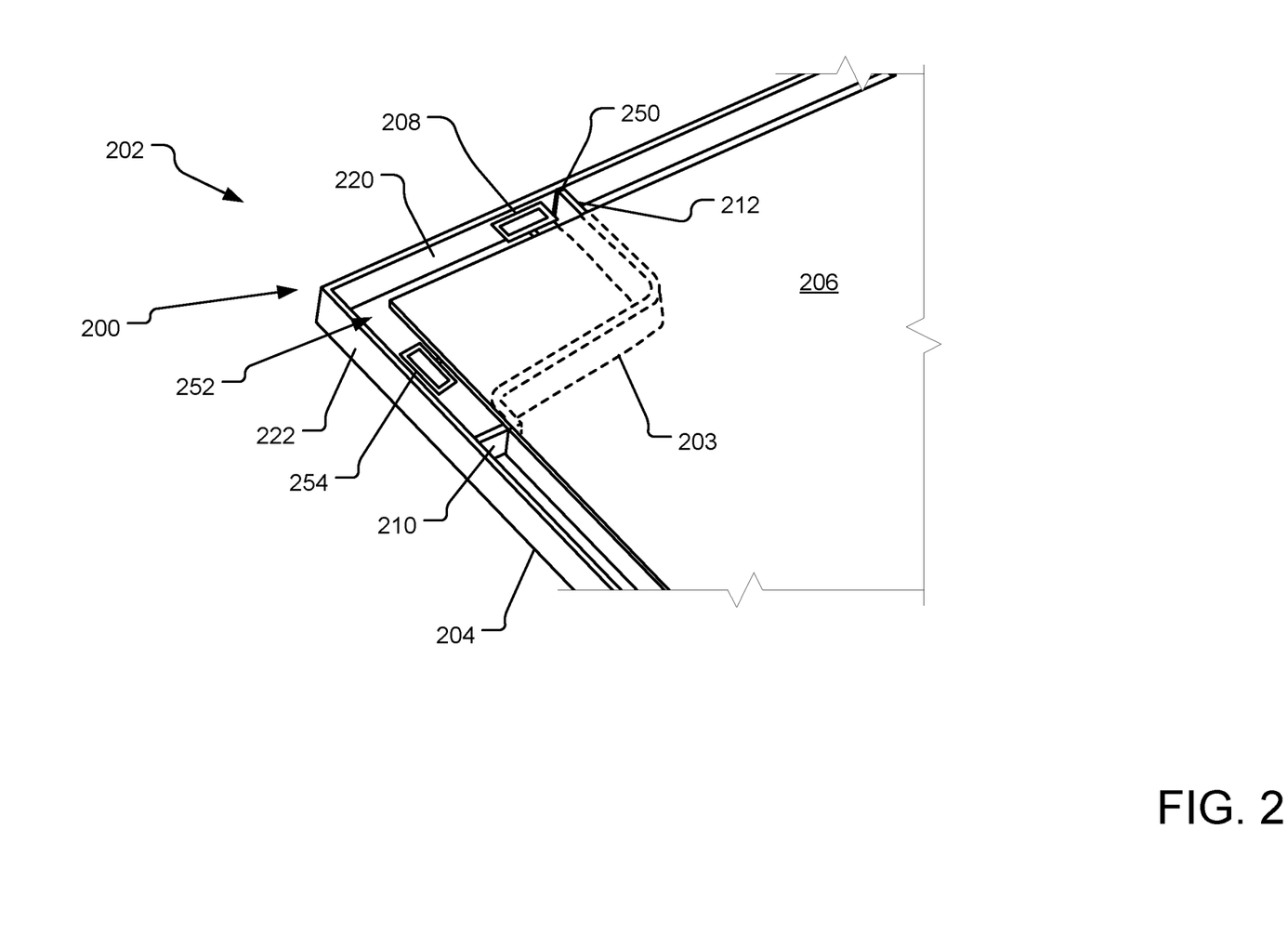
FIG. 2 illustrates a perspective view of an example hybrid cavity mode antenna.

FIG. 2 illustrates a perspective view of an example hybrid cavity mode antenna 200 in a communication device 202. All or most of the components of the communication device 202 are contained within a metal chassis 204. The bounds of a cavity of the hybrid cavity mode antenna 200 are defined in two dimensions by the conductive wall 203 (including the grounding connectors 210 and 212), a first metal edge surface 220 of the metal chassis 204, and a second metal edge surface 222 of the metal chassis 204. The bottom surface of the cavity is defined by the back metal surface of the metal chassis 204, and the top surface of the cavity is defined by the ground plane of the printed circuit board (PCB 206). An opening between the PCB 206 and the first metal edge surface 220 or the second metal edge surface 222 defines a radiating slot 252 in the cavity. One or more electrically-fed antennas are positioned within the cavity. In FIG. 2, a loop antenna 208 is electrically driven by a feed from the PCB 206 to radiate with a first radiofrequency range (e.g., encompassing 5 GHz) and is positioned within the cavity to inductively couple (and/or capacitively couple) into the cavity mode of the resulting cavity mode antenna at a second radiofrequency range (e.g., encompassing 2.5 GHz). A second loop antenna 254 is also shown to the left of the cavity. Example electrically-fed antennas may include without limitation loop antennas and monopole antennas.

In FIG. 2, the conductive wall 203 defines a portion of a cavity surface under the PCB 206. The conductive wall 203 can include one or more grounding wall connectors (see grounding wall connectors 210 and 212) that electrically connect the ground plane of the PCB 206 and the conductive wall 203 to the metal chassis 204 of the communication device 202. The dimensions of the cavity, as substantially defined by the metal chassis 204, the ground plane of the PCB 206, the conductive wall define the volume of the cavity and therefore contribute to the second radiofrequency range in which the cavity radiates.

A cavity-driving antenna may capacitively and/or inductively coupled with the cavity to drive the cavity to radiate. Various implementations may include multiple cavity-driving antennas. For example, in one implementation, two loop antennas are positioned within the cavity on opposing sides of the cavity. In other examples, one or more monopole antennas may be used to drive the cavity. In addition, multiple hybrid cavity mode antennas may be implemented in a single communication device.

In some implementations, the conductive wall 203 can also include tuning circuitry 250, such as one or more inductive and/or capacitive elements, any of which may be variable or switchable in order to dynamically adjust the tuning of the cavity antenna. It should also be understood that another electrically-conductive material may be used in place of metal for the chassis, foam, and other components. One or more tuning circuits may be employed at various locations on the cavity walls.

Figure 3:
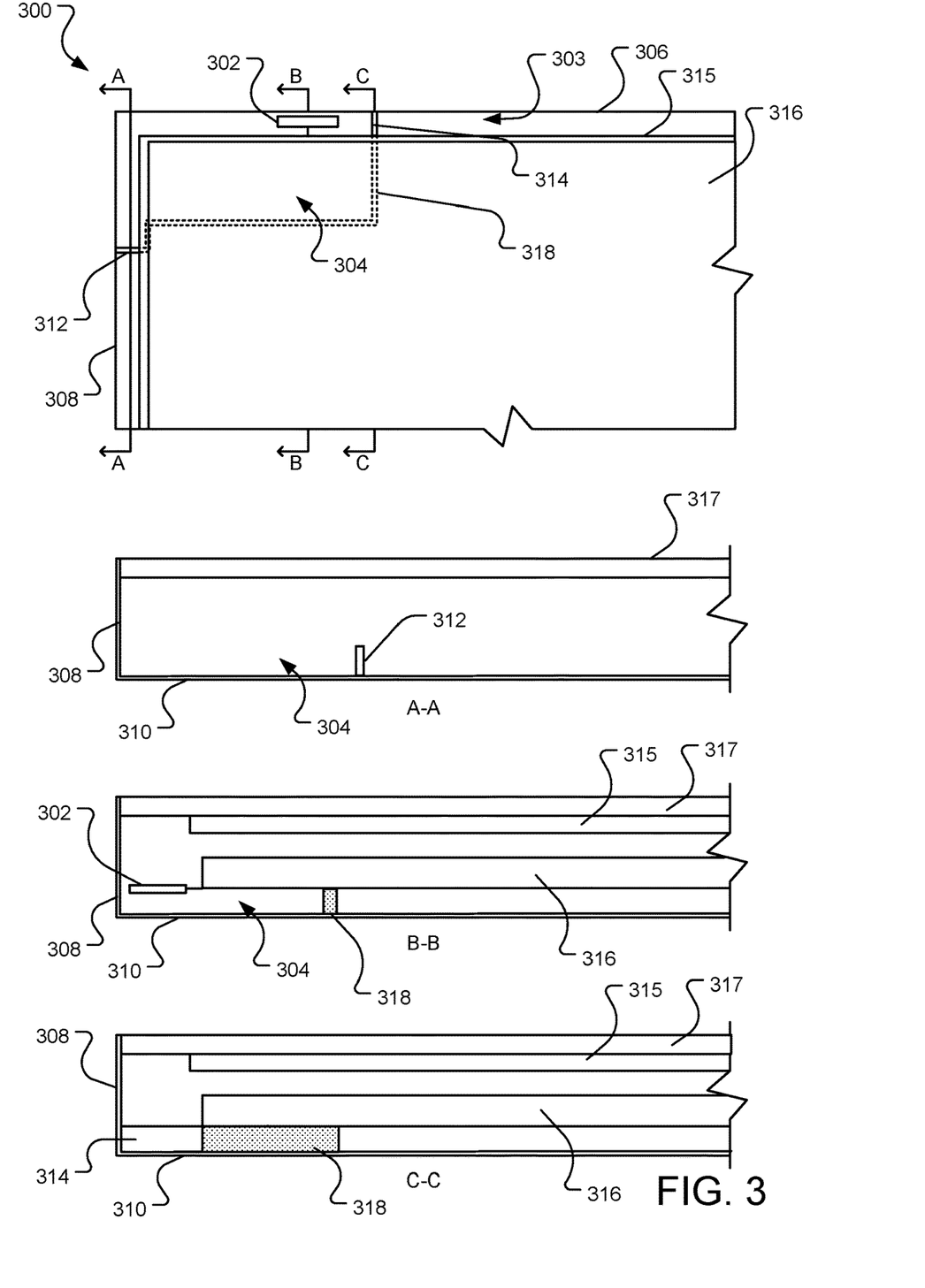
FIG. 3 illustrates a top view and three cross-sectional views of an example hybrid cavity mode antenna.

FIG. 3 illustrates a top view and three cross-sectional views of an example hybrid cavity mode antenna 300. The example hybrid cavity mode antenna 300 in a communication device includes a loop antenna 302 and a cavity antenna, the dimensions of which are defined by the cavity 304. The loop antenna 302 and at least a portion of the cavity 304 are positioned at or near the bezel region 303 of communication device between the display 315 (covered by a cover glass 317) and the side walls 306 and/or 308 of a metal chassis of the communication device. In one implementation, the loop antenna 302 radiates at a radiofrequency signal in a first radiofrequency range (e.g., 5 GHz).

In this top plan view of FIG. 3, the dimensions of the cavity 304 are defined by the side walls 306 and 308 of the metal chassis of the communication device, the back wall 310 of the metal chassis, two grounding wall connectors 312 and 314, and the ground plane of a printed circuit board 316. A conductive wall 318 connects the two grounding wall connectors 312 and 314, the back wall 310 of the metal chassis, and the ground plane of the printed circuit board 316. In one implementation, the conductive wall 318 is formed from a metal foam, which is both structural and rigid, although other conductive wall structures are contemplated, including without limitation one or more metal or otherwise conductive plates soldered to the printed circuit board 316 and the chassis surfaces. In one implementation, the loop antenna 302 is positioned within the cavity 304 and inductivity couples with the cavity 304 to radiate the cavity 304 (as a cavity antenna) at a radiofrequency signal in a second radiofrequency range (e.g., 2.5 GHz). The grounding wall connectors 312 and 314 can also be made of a metal foam, one or more conductive plates, etc.

Figure 4:
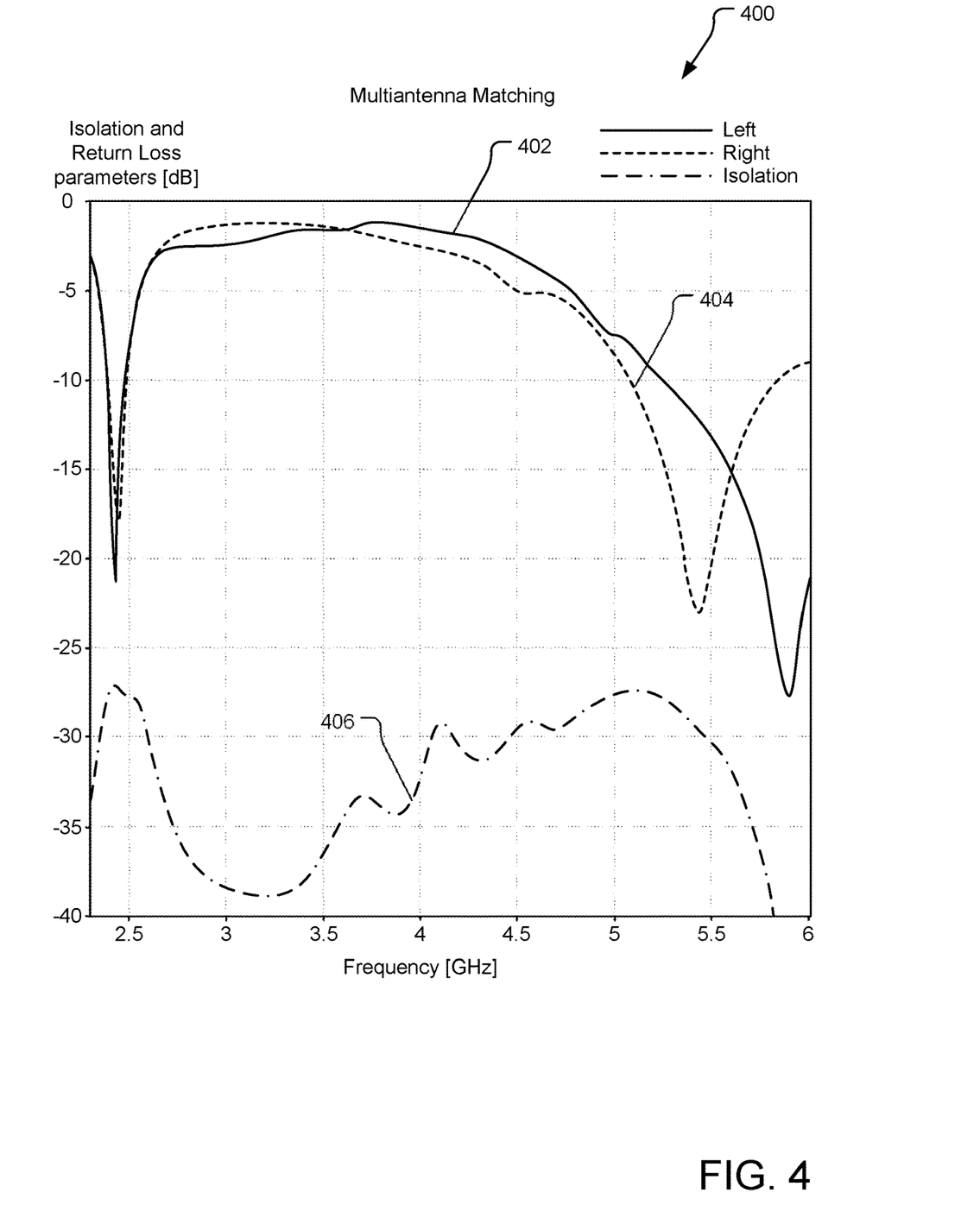
FIG. 4 illustrates characteristics of an example hybrid cavity mode antenna.

FIG. 4 illustrates characteristics 400 of an example hybrid cavity mode antenna. Lines 402 and 404 represent antenna impedances of two different loop antennas, each positioned within the cavity mode antenna, respectively. The line 402 represents the return loss of a loop antenna positioned to the left of the cavity when the cavity is viewed as shown in the plan view of FIG. 3. The line 404 represents the return loss of a loop antenna positioned to the right of the cavity when the cavity is viewed as shown in the plan view of FIG. 3 (e.g., where the loop antenna 302 is shown in FIG. 3). The line 406 represents the isolation between the two antennas, where the lower the isolation, the more efficient the two antennas operate.

Figure 5:
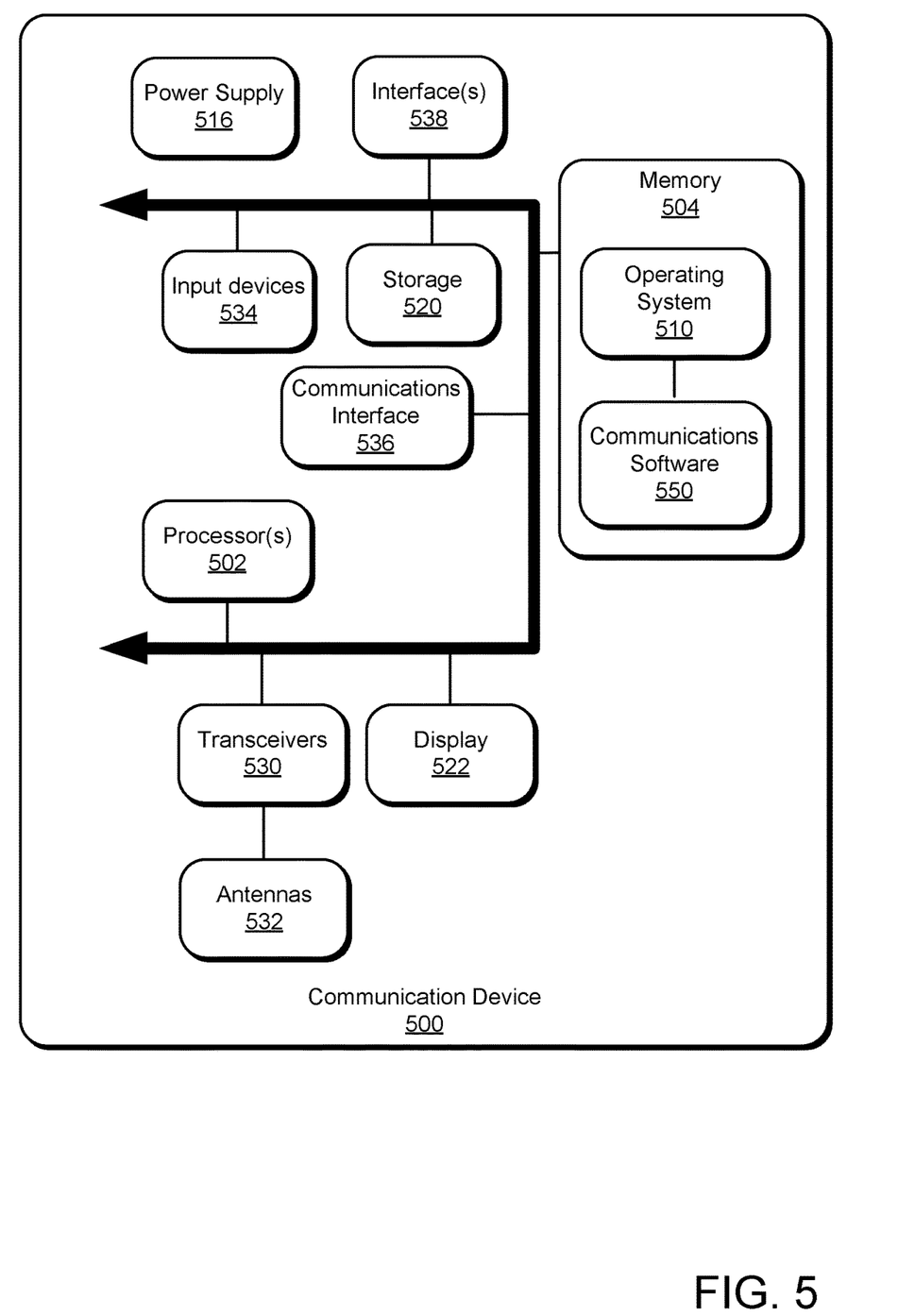
FIG. 5 illustrates an example operating environment and system for a hybrid cavity mode antenna.

FIG. 5 illustrates an example communication device 500 for implementing the features and operations of the described technology. The communication device 500 may be a client device, such as a laptop, mobile device, desktop, tablet; a server/cloud device; an internet-of-things device; an electronic accessory; or another electronic device. The communication device 500 includes one or more processor(s) 502 and a memory 504. The memory 504 generally includes both volatile memory (e.g., RAM) and non-volatile memory (e.g., flash memory). An operating system 510 resides in the memory 504 and is executed by the processor(s) 502.

In an example communication device 500, as shown in FIG. 5, one or more modules or segments, such as communication software 550, application modules, and other modules, are loaded into the operating system 510 on the memory 504 and/or storage 520 and executed by processor(s) 502. The storage 520 may store communication parameters and other data and be local to the communication device 500 or may be remote and communicatively connected to the communication device 500.

The communication device 500 includes a power supply 516, which is powered by one or more batteries or other power sources and which provides power to other components of the communication device 500. The power supply 516 may also be connected to an external power source that overrides or recharges the built-in batteries or other power sources.

The communication device 500 may include one or more communication transceivers 530 which may be connected to one or more antenna(s) 532 to provide network connectivity (e.g., mobile phone network, Wi-Fi®, Bluetooth®) to one or more other servers and/or client devices (e.g., mobile devices, desktop computers, or laptop computers). The communication device 500 may further include a network adapter 536, which is a type of communication device. The communication device 500 may use the adapter and any other types of communication devices for establishing connections over a wide-area network (WAN) or local-area network (LAN). It should be appreciated that the network connections shown are exemplary and that other communication devices and means for establishing a communications link between the communication device 500 and other devices may be used.

The communication device 500 may include one or more input devices 534 such that a user may enter commands and information (e.g., a keyboard or mouse). These and other input devices may be coupled to the server by one or more interfaces 538, such as a serial port interface, parallel port, or universal serial bus (USB). The communication device 500 may further include a display 522, such as a touch screen display.

The communication device 500 may include a variety of tangible processor-readable storage media and intangible processor-readable communication signals. Tangible processor-readable storage can be embodied by any available media that can be accessed by the communication device 500 and includes both volatile and nonvolatile storage media, removable and non-removable storage media. Tangible processor-readable storage media excludes intangible communications signals and includes volatile and nonvolatile, removable and non-removable storage media implemented in any method or technology for storage of information such as processor-readable instructions, data structures, program modules or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other tangible medium which can be used to store the desired information and which can be accessed by the communication device 500. In contrast to tangible processor-readable storage media, intangible processor-readable communication signals may embody processor-readable instructions, data structures, program modules or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Figure 6:
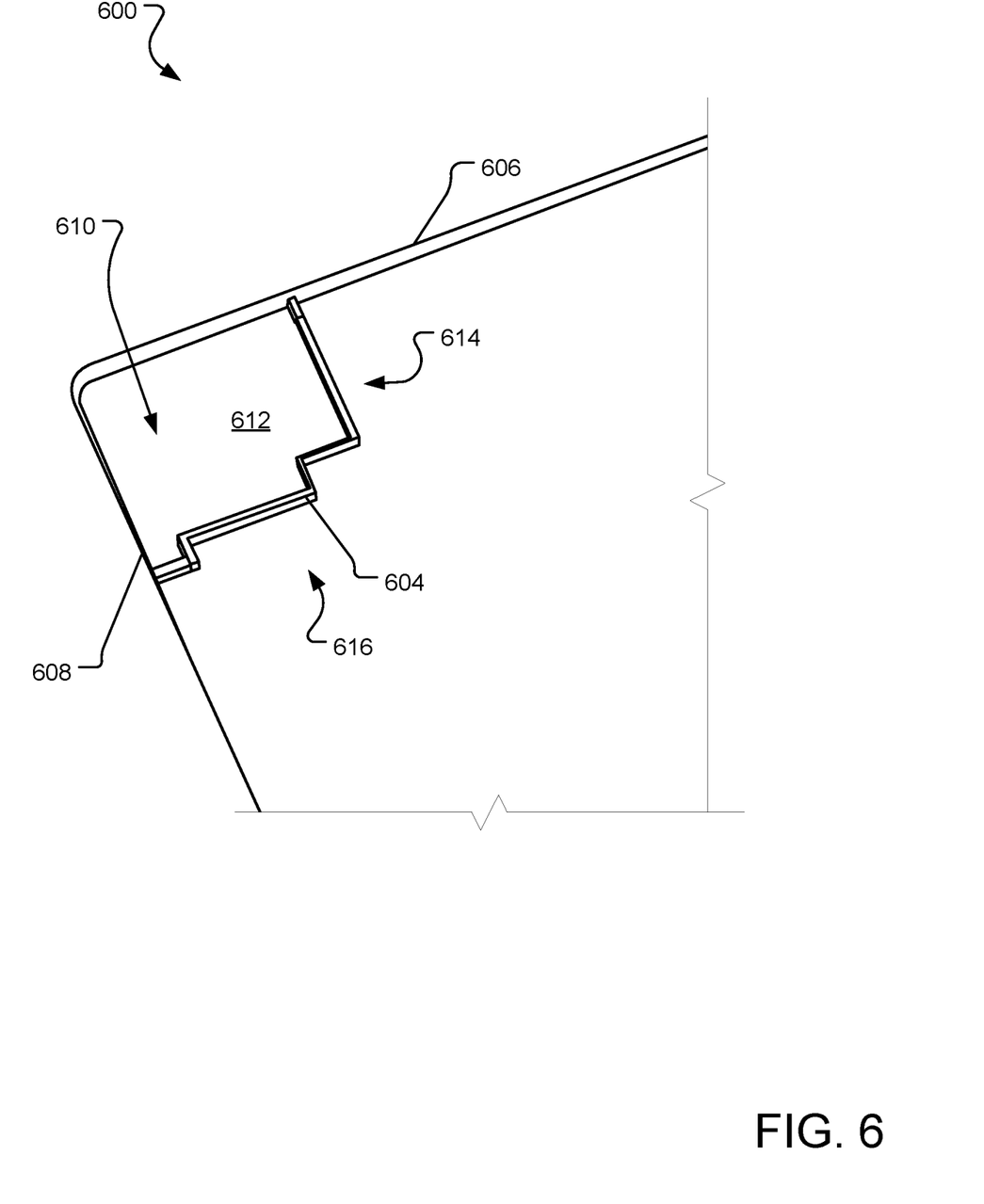
FIG. 6 illustrates an example implementation of a hybrid cavity mode antenna.

FIG. 6 illustrates an example implementation of a hybrid cavity mode antenna in a communication device 600. All or most of the components of the communication device 600 are contained within a metal chassis (or an otherwise electrically conductive chassis). A conductive wall 604 is shown connecting a first edge surface 606 of the metal chassis to a second edge surface 608 of the metal chassis, forming a cavity within the area 610. The cavity is also bounded (above and below) by the bottom surface 612 of the metal chassis and a printed circuit board (not shown) of the communication device 600. Such boundaries form a cavity volume. In FIG. 6, the conductive wall 604 is constructed from metal plates, but one or more portions of the conductive wall 604 may be formed from metal foam or other conductive materials.

In the illustrated implementation, the cavity is bounded by a first side 614 of the conductive wall 604 of approximately 40 mm and a second side 616 of the conductive wall 604 of approximately 86 mm. The opening between the metal chassis and the printed circuit board presents a slot in the cavity from which a radiofrequency signal can radiate. As such, the described implementation can operate as a cavity-backed slot antenna. A feed antenna (such as a loop antenna or a monopole antenna) would be positioned within the cavity, operating at approximately 5 GHz and driving the cavity and the radiating slot at approximately 2.5 GHz.

Cavity dimensions and supported frequencies can vary in different implementations. In one implementation, 2.4 GHz corresponds to a cavity mode in this design as 15000 millimeters$^3$, and 5.2 GHz corresponds to a cavity mode in this design as 3990 millimeters$^3$, although other volumes, dimensions, and frequency band may be employed.

While this specification contains many specific implementation details, these should not be construed as limitations on the scope of any inventions or of what may be claimed, but rather as descriptions of features specific to particular embodiments of a particular described technology. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

An example communication device (100) includes a metal chassis (108), a printed circuit board (114) positioned within the metal chassis, and a hybrid cavity mode antenna (102). The hybrid mode antenna includes a conductive wall (118) defining at least a portion of a cavity (110), wherein the cavity is further defined by one or more surfaces of the metal chassis and the printed circuit board. The hybrid cavity mode antenna also includes an electrically-fed antenna (104) configured to radiate a first radiofrequency signal in a first frequency range, wherein the electrically-fed antenna is electrically driven from the printed circuit board of the communication device, the electrically-fed antenna being positioned within the cavity to drive the cavity to radiate a second radiofrequency signal in a second frequency range.

Another example communication device of any preceding device is provided, wherein the metal chassis includes a metal back surface (310) and at least a first metal edge surface (606) and a second metal edge surface (608), the cavity being defined by the metal back surface, the first metal edge surface, the second metal edge surface, the printed circuit board, and the conductive wall.

Another example communication device of any preceding device is provided, wherein the conductive wall includes a tuning circuit (250) connecting the conductive wall to at least one of the first metal edge surface and the second metal edge surface.

Another example communication device of any preceding device is provided, wherein the communication device includes a display (112) and a bezel region (116) between the display and the first metal edge surface, and the cavity includes a radiating slot (252) positioned in the bezel region.

Another example communication device of any preceding device is provided, wherein the conductive wall includes at least one grounding wall connector (212) electrically connected to the first metal edge surface.

Another example communication device of any preceding device is provided, wherein the metal chassis includes a metal back surface, and the conductive wall is positioned between the printed circuit board and the metal back surface.

Another example communication device of any preceding device is provided, wherein the metal chassis includes a metal back surface and at least a first metal edge surface and a second metal edge surface, the conductive wall extending across the metal back surface from the first metal edge surface to the second metal edge surface.

Another example communication device of any preceding device is provided, wherein the conductive wall electrically connects the metal back surface, the first metal edge surface, and the second metal edge surface.

Another example communication device of any preceding device is provided, wherein the electrically-fed antenna is a first electrically-fed antenna, and further including a second electrically-fed antenna (254) configured to radiate a third radiofrequency signal in the first frequency range, wherein the second electrically-fed antenna is electrically driven from the printed circuit board of the communication device, the second electrically-fed antenna being positioned within the cavity to drive the cavity to radiate the second radiofrequency signal in the second frequency range.

Another example communication device of any preceding device is provided, wherein the second electrically-fed antenna is a loop antenna.

Another example communication device of any preceding device is provided, wherein the second electrically-fed antenna is a monopole antenna.

Another example communication device of any preceding device is provided, wherein the first electrically-fed antenna is positioned at one side of the cavity and the second electrically-fed antenna is positioned at an opposing side of the cavity.

Another example communication device of any preceding device is provided, wherein the first electrically-fed antenna is a loop antenna.

Another example communication device of any preceding device is provided, wherein the conductive wall includes a metal foam.

Another example communication device of any preceding device is provided, wherein the metal chassis includes a metal back surface and at least a first metal edge surface, a second metal edge surface, and a third metal edge surface (150), the hybrid cavity mode antenna is a first hybrid cavity mode antenna with the conductive wall extending across the metal back surface from the first metal edge surface to the second metal edge surface, and the communication device further includes a second hybrid cavity mode antenna (152) including a second conductive wall extending across the metal back surface from the first metal edge surface to the third metal edge surface.

An example hybrid cavity mode antenna (102) includes an electrically-conductive chassis (108) for a communication device (100), the electrically-conductive chassis having an electrically-conductive back surface (310), a first electrically-conductive edge surface (606), and a second electrically-conductive edge surface (608). The example hybrid cavity mode antenna further includes a conductive wall (118) defining at least a portion of a cavity (110), wherein the cavity is further defined by the electrically-conductive back surface, the first electrically-conductive edge surface, and the second electrically-conductive edge surface of the electrically-conductive chassis, and an electrically-fed antenna (104) configured to radiate a first radiofrequency signal in a first frequency range, wherein the electrically-fed antenna is positioned within the cavity to drive the cavity to radiate a second radiofrequency signal in a second frequency range.

Another example hybrid cavity mode antenna of any preceding antenna is provided, wherein the electrically-fed antenna is a loop antenna.

Another example hybrid cavity mode antenna of any preceding antenna is provided, wherein the conductive wall electrically contacts the electrically-conductive back surface, the first electrically-conductive edge surface, and the second electrically-conductive edge surface.

Another example hybrid cavity mode antenna of any preceding antenna is provided, wherein the conductive wall includes at least one grounding wall connector (212) electrically connected to the first electrically-conductive edge surface.

Another example hybrid cavity mode antenna of any preceding antenna is provided, wherein the conductive wall includes an electrically-conductive foam.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

A number of implementations of the described technology have been described. Nevertheless, it will be understood that various modifications can be made without departing from the spirit and scope of the recited claims.

What is claimed is:

1. A communication device comprising:
a metal chassis;
a printed circuit board positioned within the metal chassis; and
a hybrid cavity mode antenna, the hybrid cavity mode antenna including:
a conductive wall defining at least a portion of a cavity, wherein the cavity is further defined by one or more surfaces of the metal chassis and the printed circuit board, wherein the metal chassis includes a metal surface that is substantially parallel to a surface of the printed circuit board, and the conductive wall and the cavity are positioned between the surface of the printed circuit board and the metal surface, and
an electrically-fed antenna configured to radiate a first radiofrequency signal in a first frequency range, wherein the electrically-fed antenna is electrically driven from the printed circuit board of the communication device, the electrically-fed antenna being positioned within the cavity to drive the cavity to radiate a second radiofrequency signal in a second frequency range.

2. The communication device of claim 1, wherein the metal surface is a metal back surface of the metal chassis, and the metal chassis further includes at least a first metal edge surface and a second metal edge surface, the cavity being at least partially defined by the metal surface, the first metal edge surface, the second metal edge surface, the printed circuit board, and the conductive wall.

3. The communication device of claim 2, wherein a tuning circuit connects the conductive wall to the first metal edge surface or the second metal edge surface.

4. The communication device of claim 2, wherein the communication device includes a display and a bezel region between the display and the first metal edge surface, and the cavity includes a radiating slot positioned in the bezel region.

5. The communication device of claim 2, wherein the conductive wall includes at least one grounding wall connector electrically connected to the first metal edge surface.

6. The communication device of claim 1, wherein the metal surface is a metal back surface of the metal chassis, and the conductive wall is positioned between the printed circuit board and the metal back surface.

7. The communication device of claim 1, wherein the metal surface is a metal back surface of the metal chassis, and the metal chassis further includes at least a first metal edge surface and a second metal edge surface, the conductive wall extending across the metal back surface from the first metal edge surface to the second metal edge surface.

8. The communication device of claim 7, wherein the conductive wall electrically connects the metal back surface, the first metal edge surface, and the second metal edge surface.

9. The communication device of claim 1, wherein the electrically-fed antenna is a first electrically-fed antenna, and further comprising:
a second electrically-fed antenna configured to radiate a third radiofrequency signal in the first frequency range, wherein the second electrically-fed antenna is electrically driven from the printed circuit board of the communication device, the second electrically-fed antenna being positioned within the cavity to drive the cavity to radiate the second radiofrequency signal in the second frequency range.

10. The communication device of claim 9, wherein the second electrically-fed antenna is a loop antenna.

11. The communication device of claim 9, wherein the second electrically-fed antenna is a monopole antenna.

12. The communication device of claim 9, wherein the first electrically-fed antenna is positioned at one side of the cavity and the second electrically-fed antenna is positioned at an opposing side of the cavity.

13. The communication device of claim 9, wherein the first electrically-fed antenna is a loop antenna.

14. The communication device of claim 1, wherein the conductive wall includes a metal foam.

15. The communication device of claim 1, wherein the metal surface is a metal back surface of the metal chassis and the metal chassis further includes at least a first metal edge surface, a second metal edge surface, and a third metal edge surface, the hybrid cavity mode antenna is a first hybrid cavity mode antenna with the conductive wall extending across the metal back surface from the first metal edge surface to the second metal edge surface, and the communication device further comprises:
a second hybrid cavity mode antenna including a second conductive wall extending across the metal back surface from the first metal edge surface to the third metal edge surface.

16. A hybrid cavity mode antenna comprising:
an electrically-conductive chassis for a communication device, the electrically-conductive chassis having an electrically-conductive surface, a first electrically-conductive edge surface, and a second electrically-conductive edge surface;
a printed circuit board positioned within the electrically-conductive chassis;
a conductive wall defining at least a portion of a cavity, wherein the cavity is further defined by the printed circuit board, the electrically-conductive surface, the first electrically-conductive edge surface, and the second electrically-conductive edge surface of the electrically-conductive chassis, wherein the electrically-conductive surface is substantially parallel to a surface of the printed circuit board, and the conductive wall and the cavity are positioned between the surface of the printed circuit board and the electrically-conductive surface; and
an electrically-fed antenna configured to radiate a first radiofrequency signal in a first frequency range, wherein the electrically-fed antenna is positioned within the cavity to drive the cavity to radiate a second radiofrequency signal in a second frequency range.

17. The hybrid cavity mode antenna of claim 16, wherein the electrically-fed antenna is a loop antenna.

18. The hybrid cavity mode antenna of claim 16, wherein the conductive wall electrically contacts the electrically-conductive surface, the first electrically-conductive edge surface, and the second electrically-conductive edge surface.

19. The hybrid cavity mode antenna of claim 16, wherein the conductive wall includes at least one grounding wall connector electrically connected to the first electrically-conductive edge surface.

20. The hybrid cavity mode antenna of claim 16, wherein the conductive wall includes an electrically-conductive foam.

21. The communication device of claim 1, wherein the electrically-fed antenna is positioned relative to the cavity to drive the cavity with the first radiofrequency signal to radiate the second radiofrequency signal.

22. The communication device of claim 1, wherein the electrically-fed antenna is positioned relative to the cavity to electromagnetically couple with the cavity to radiate the second radiofrequency signal.

23. The communication device of claim 1, wherein the cavity includes an opening between the printed circuit board and the metal chassis from which the second radiofrequency signal radiates.

24. The communication device of claim 1, wherein a tuning circuit connects the conductive wall to the metal chassis.

* * * * *